US012801900B2

(12) United States Patent
Bonnet et al.

(10) Patent No.: US 12,801,900 B2
(45) Date of Patent: Nov. 17, 2026

(54) BAYESIAN NEURAL NETWORK WITH RESISTIVE MEMORY HARDWARE ACCELERATOR AND METHOD FOR PROGRAMMING THE SAME

(71) Applicant: Commissariat à l'énergie atomique et aux énergies alternatives, Paris (FR)

(72) Inventors: Djohan Bonnet, Grenoble Cedex (FR); Thomas Dalgaty, Grenoble Cedex (FR); Tifenn Hirtzlin, Grenoble Cedex (FR); Elisa Vianello, Grenoble Cedex (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 885 days.

(21) Appl. No.: 18/067,088

(22) Filed: Dec. 16, 2022

(65) Prior Publication Data

US 2023/0196082 A1 Jun. 22, 2023

(30) Foreign Application Priority Data

Dec. 17, 2021 (EP) ..................................... 21215735

(51) Int. Cl.
*G11C 11/54* (2006.01)
*G06N 3/047* (2023.01)
(Continued)

(52) U.S. Cl.
CPC ............. *G06N 3/047* (2023.01); *G06N 3/063* (2013.01); *G06N 3/065* (2023.01); *G06N 3/088* (2013.01);
(Continued)

(58) Field of Classification Search
CPC ........ G06N 3/047; G06N 3/063; G06N 3/065; G06N 3/088; G06N 7/01; G06N 20/00; G06N 3/044; G06N 3/0475
See application file for complete search history.

(56) References Cited

U.S. PATENT DOCUMENTS 11,710,026 B2 * 7/2023 Kim ......................... G06N 3/09 706/15
2017/0221558 A1 * 8/2017 Hu ..................... G11C 13/0061
(Continued)

FOREIGN PATENT DOCUMENTS

EP 2 167 045 A2 3/2010
EP 3 825 927 A1 5/2021
EP 3 907 667 A1 11/2021

OTHER PUBLICATIONS

Extended European Search Report issued Oct. 10, 2022 in European Patent Application No. 21215735.8, 15 pages.
(Continued)

*Primary Examiner* — Mushfique Siddique
(74) *Attorney, Agent, or Firm* — Oblon, McClelland, Maier & Neustadt, L.L.P.

(57) ABSTRACT

The present invention concerns a method for programming a Bayesian neural network (BNN) in a RRAM memory. After the BNN has been trained on a dataset D, the joint posterior probability distribution of the synaptic coefficients, p(w|D) is decomposed into a mixture of multivariate mean-field Gaussian components by GMM. The weighting coefficients and the parameters of these multivariate Gaussian components are estimated by MDEM (Multi-Dimensional Expectation Maximization) with two constraints. According to the first constraint, the off-diagonal terms of the covariance matrix of each component are forced to zero. According to the second constraint, the couples of mean values and diagonal terms of the covariance matrix of each component
(Continued)

are constrained to belong to a hardware compliance domain determined by a relationship between the conductance mean value and conductance standard deviation of a memristor programmed by a SET or RESET operation. The weighting factors and mean values of these components are then transferred to the chip implementing the BNN, and the memristors of the RRAM are programmed accordingly.

20 Claims, 8 Drawing Sheets

(51) Int. Cl.

| | |
|---|---|
| ***G06N 3/063*** | (2023.01) |
| ***G06N 3/065*** | (2023.01) |
| ***G06N 3/088*** | (2023.01) |
| ***G06N 7/01*** | (2023.01) |
| *G06N 20/00* | (2019.01) |

(52) U.S. Cl.

CPC ................ *G06N 7/01* (2023.01); *G11C 11/54* (2013.01); *G06N 20/00* (2019.01)

(56) References Cited

U.S. PATENT DOCUMENTS

| | | | | |
|---|---|---|---|---|
| 2021/0097379 | A1* | 4/2021 | Yang | G06N 3/048 |
| 2021/0350218 | A1 | 11/2021 | Dalgaty et al. | |
| 2022/0121915 | A1* | 4/2022 | Wagle | G06N 3/0495 |
| 2023/0125074 | A1* | 4/2023 | Dalgaty | G06N 3/063 706/26 |
| 2023/0196082 | A1* | 6/2023 | Bonnet | G06N 3/047 706/15 |
| 2023/0377647 | A1* | 11/2023 | Hirtzlin | G11C 13/0002 |

OTHER PUBLICATIONS

Zhang et al., "Bayesian Neural Network with Efficient Priors for Online Quality Prediction", Digital Chemical Engineering, 2022, vol. 2, pp. 1-8, XP055937187.

Dalgaty et al., "Ex Situ Transfer of Bayesian Neural Networks to Resistive Memory-Based Inference Hardware", Advanced Intelligent Systems, 2021, vol. 3, p. 1-9, XP055910829, Retrieved from the Internet: URL:https://onlinelibrary.wiley.com/doi/full-XML/10.1002/aisy.202000103>.

Zhou et al., "Bayesian Neural Network Enhancing Reliability Against Conductance Drift for Memristor Neural Networks", Science China Information Sciences, 2021, vol. 64, 12 pages, XP037441800.

Dalgaty et al., "Harnessing Intrinsic Memristor Randomness with Bayesian Neural Networks", 2021 International Conference on IC Design and Technology (ICICDT), IEEE, 2021, 4 pages, XP034037701.

Liao et al., "Weighted Synapses Without Carry Operations for RRAM-Based Neuromorphic Systems", Methods, Frontiers in Neuroscience, 2018, vol. 12, Article 167, pp. 1-9.

Carboni et al., "Stochastic Memory Devices for Security and Computing", Advanced Electronic Materials, 2019, vol. 5, pp. 1-27.

Dalgaty et al., "In Situ Learning Using Intrinsic Memristor Variability via Markov Chain Monte Carlo Sampling", Nature Electronics, 2021, vol. 4, pp. 151-161.

Blundell et al., "Weight Uncertainty in Neural Networks", $32^{nd}$ International Conference on Machine Learning, 2015, 10 pages.

Kucukelbir et al., "Automatic Differentiation Variational Inference", Journal of Machine Learning Research, 2017, vol. 18, pp. 1-45.

* cited by examiner

BAYESIAN NEURAL NETWORK WITH RESISTIVE MEMORY HARDWARE ACCELERATOR AND METHOD FOR PROGRAMMING THE SAME

FIELD OF THE INVENTION

The present invention concerns the field of machine learning (ML) and more specifically Bayesian neural networks (BNNs). It also relates to the field of resistive Random Access Memories (RRAMs).

BACKGROUND OF THE INVENTION

With the development and applications of deep learning algorithms, artificial neural networks (ANNs), hereinafter simply referred to as neural networks, have achieved tremendous success in various fields such as image classification, object recognition, natural language processing, autonomous driving, cancer detection, etc.

However conventional neural networks are prone to overfitting, that is to situations where the network model fail to generalize well from the training data to new data. The underlying reason for this shortcoming is that the ANN model parameters, i.e. the synaptic coefficients (or weights), do not capture the uncertainty of modelling, namely the uncertainty about which values of these parameters will be good at predicting or classifying new data. This is particularly true when using scarce or noisy training data. Conversely, reliable ANN model parameters require huge amount of training data.

To capture modelling uncertainty a probabilistic programming approach can be adopted. That is, in contrast to traditional ANNs whose weights are fixed values, each weight is a random variable following a posterior probability distribution, conditioned on a prior probability distribution and the observed data, according to Bayes rule. Such neural networks are called Bayesian neural networks (BNNs). BNNs can learn from small datasets, achieve higher accuracy and are robust to overfitting.

From a practical point of view, BNN can be regarded as an ensemble of neural networks (NNs) whose respective weights have been sampled from the posterior probability distribution $p(w|D)$, where w is the flattened vector conventionally representing all weights of the network (i.e. all weights of the network are arranged consecutively in vector w) and D is the training dataset. The training dataset is comprised of data $x^{(i)}$ and their corresponding labels $z^{(i)}$, i=1, . . . , S. For classification, $z^{(i)}$ is a set of classes and, for regression, a value of a continuous variable.

After the BNN has been trained, it can be used (for prediction or classification) on new data. More specifically, if we denote $x_0$ the vector input representing new data, the output of the BNN is obtained by averaging the output of NNs sampled according to the posterior probability distribution:

$$z = E_{p(w|D)}[f(x_0, w)] \tag{1}$$

where $f$ denotes the network function and $E_{p(w|D)}$ denotes the expectation according to the posterior probability distribution of the weights, $p(w|D)$.

The posterior probability distribution can be calculated according to Bayes rule as:

$$p(w \mid D) = \frac{p(D \mid w)p(w)}{p(D)} \tag{2}$$

where $$p(D) = \int p(D \mid w)p(w)dw.$$

The calculation of the latter integral is generally intractable and therefore different techniques have been proposed in the prior art in order to approximate the posterior probability distribution, p(wD), like Markov Chain Monte Carlo (MCMC) sampling or variational inference.

The training of a BNN requires substantial processing and storage resources which are unavailable in most implementation platforms such as IoT devices or even edge computing nodes. A known solution is to shift the computation burden to the Cloud and train the BNN ex situ. The resulting parameters of the weight probability distribution are then transferred to the inference engine located in the implementation platform.

The inference engine nevertheless needs to sample the weights of the BNN according to the posterior probability distribution $p(w|D)$ and perform the calculation of network function $f$ for each sample, before output averaging. However, calculation of the network function entails intensive dot product computation.

Various hardware accelerators have been proposed for generating samples according to a Gaussian distribution law and for performing dot product calculation.

In particular, resistive memories (RRAMs) have been used for dot product computation in the training and the predicting phases. RRAMs are nanoscale non-volatile memory devices whose conductive states can be programmed under application of voltage and current pulses.

In such a memory, the dot product between an input voltage vector and an array of conductance values stored in the RRAM is obtained as a sum of currents according to Kirchhoff's circuit law. An example of use of RRAMs for dot product computation in a neural network can be found in the article of Y. Liao et al. entitled "Weighted synapses without carry operations for RRAM-based neuromorphic systems" published in Front. Neuroscience, 16 Mar. 2018.

The specificity of a RRAM cell is that, for a given set of programming conditions, its conductance follows a normal law. While this property of random conductance distribution renders the RRAM unfit for use in conventional (deterministic) ANNs, it can be leveraged for implementing synapses in BNNs. More specifically, as disclosed in co-pending patent application EP2167045 and EP-A3 825 927 filed by the Applicant, each synapse of a BNN associated with a synaptic coefficient g (having a signed value) is implemented by a cell comprising a first resistor storing a first branch coefficient, $g^+$ (having a positive value) and a second resistor storing a second branch coefficient, $g^-$ (also having a positive value), the synaptic coefficient g being expressed as the difference between the first and the second branch coefficients.

The posterior marginal probability distribution function (PDF), $p(w|D)$, of each synaptic coefficient w, that is the probability distribution knowing the training dataset, can be represented as a Gaussian mixture model (GMM) or, said differently, can be approximated by a linear combination of a plurality of Gaussian components, the weighting factors of this linear combination being obtained by an Expectation-Maximization algorithm as described in aforementioned patent application EP2167045. Each Gaussian component, defined by a mean value (or equivalently median value) and a standard deviation, can be implemented by using the cycle-to-cycle variability of a RRAM cell during a SET operation.

Indeed, it is recalled that, during a SET operation, a strong electric field is applied to the cell while limiting its current to a programming current value. This operation forms a conductive filament through the dielectric and confers to the resistor a high conductance value, which depends upon the programming current value.

Conversely, during a RESET operation, a programming voltage is applied to the cell with the opposite polarity than the one used for electroforming. This voltage breaks the filament and the resistor returns therefore to a low conductance value, which depends upon the programming voltage value.

A detailed description of RRAM can be found in the article by R. Carboni et al., entitled "Stochastic memory devices for security and computing", published in Adv. Electron. Mat., 2019, 5, 1900198, pages 1-27.

Once a cell has been programmed by a SET operation, the obtained high conductance value is stable in time until the next operation is performed. However, the high conductance value varies from one SET operation to the next, even if the programming current is kept constant.

More specifically, for a given programming current, the high conductance in the HCS state can be considered as a random variable which exhibits a normal distribution over the SET operations. The mean value and the standard deviation of this normal distribution are determined by the programming current used during the SET operations.

However, programming a RRAM cell to represent a sample of a Gaussian random variable suffers from two constraints.

The first constraint is illustrated in FIG. 1 which shows the relationship between the conductance median value and the cycle-to-cycle standard deviation of the conductance of a RRAM with respect to the SET programming current. More precisely, the x-axis indicates (in logarithmic scale) the programming current (in μA) during the SET operation. The γ-axis on the left indicates (in logarithmic scale) the median value (in Siemens) of the conductance of the resistor once the RRAM has been programmed, whereas the γ-axis on the right indicates (in logarithmic scale) the cycle-to-cycle standard deviation (as a percentage of the median) of the conductance of the RRAM thus programmed.

It can be shown that the median value of the conductance, $g_{median}$, in high conductance state (HCS), follows a power law of the type conductance, $g_{median}$, in high conductance state, follows a power law of the type $g_{median}=\alpha(I^{SET})^{\gamma}$ where $\alpha$ and $\gamma$ are positive coefficients and $I^{SET}$ is the intensity of the current injected in the resistor during the SET operation. Furthermore, the evolution of the standard deviation (in Siemens) vs. the median value of the conductance can be approximated by a linear function of the type $\sigma=\sigma_0-\eta g^{median}$ where $\sigma_0$ is a constant and $\eta$ is a positive coefficient. Hence, if the mean value of the HCS conductance probability distribution is increased, the standard deviation is necessarily increased too.

It results from the above that the mean value and the C2C standard deviation of the conductance are strongly correlated and therefore cannot be chosen independently from each other. In other words, the space of random Gaussian variables for implementing the synaptic coefficients is bounded to a one-dimensional space.

The second constraint stems from the fact that the random variables representing the synaptic coefficients of a BNN are not independent from each other, especially if the BNN has been trained by Markov Chain Monte Carlo (MCMC) as described in article of T. Dalgaty et al. entitled "In situ learning using intrinsic memristor variability via Markov chain Monte Carlo sampling" published in Nat. Electron. 4, 151-161 (2021). Furthermore, when the parameters of the model, that is the synaptic coefficients of the BNN are stored in the RRAM as differential pairs of weights (or branch coefficients), a first branch coefficient, $g^{+}$, being associated with a positive input and a second branch coefficient, $g^{-}$, being associated with a negative input of a neuron, as described above, the two branch coefficients are generally correlated.

However, in the prior art, the programming of the RRAM, after ex situ training of the BNN, was based on an EM (expectation maximization) algorithm which failed to capture the dependence of the synaptic/branch coefficients. This dependence was taken into account by orderly programming the RRAM in a row-wise fashion, a row of the RRAM corresponding to a sample of the posterior probability distribution p(w|D).

The object of the present invention is therefore to remedy the shortcomings of the known methods for training a BNN to be implemented in a RRAM memory, in particular to relax the above-mentioned constraints due to mean value vs. standard deviation correlation in memristors and the dependency of the synaptic/branch coefficients.

BRIEF DESCRIPTION OF THE INVENTION

The present invention is defined by the appended independent claims. Various preferred embodiments are defined in the dependent claims.

BRIEF DESCRIPTION OF THE DRAWINGS

The present invention will be better understood from the description of the following embodiments, by way of illustration and in no way limitative thereto.

DETAILED DISCLOSURE OF PARTICULAR EMBODIMENTS

Figure 1:
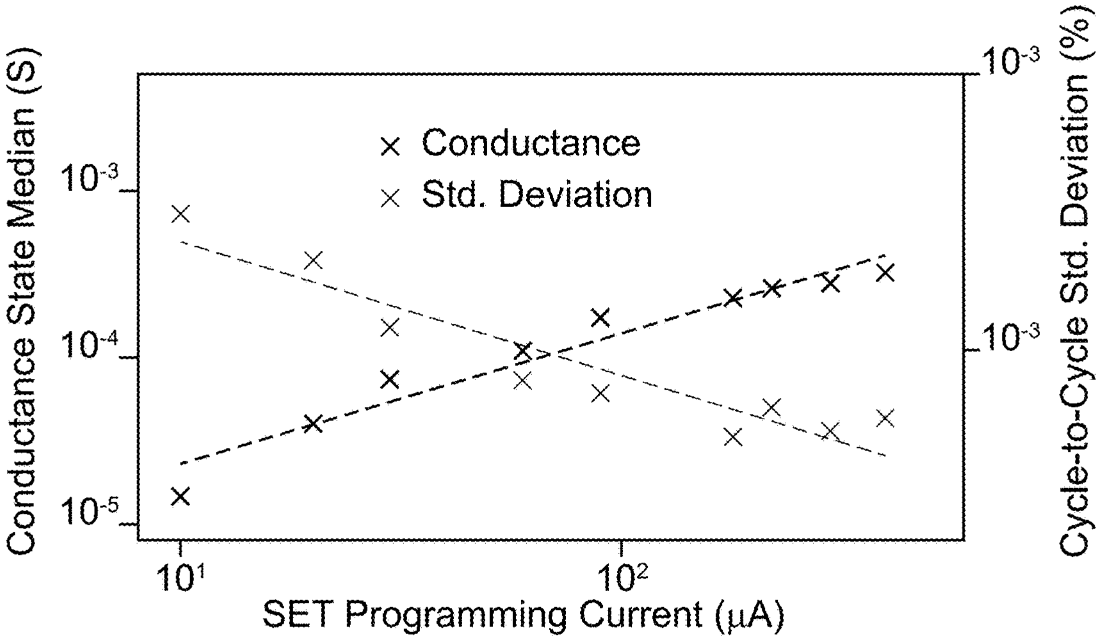
FIG. 1 shows the evolution of the median and the standard deviation of the conductance vs. the SET programming current in a RRAM cell.

We are considering in the following a Bayesian neural network (BNN) as introduced in description of the prior art.

The BNN is first trained on the basis of a training dataset denoted $D=\{x^{(i)}, z^{(i)}\}$ where $x^{(i)}$ is the input data on which the neural network has to be trained and $z^{(i)}$ (or $z^{(i)}$ if the output is scalar) the corresponding labels.

After it has been trained, a BNN is associated with a joint posterior probability distribution $p(w|D)$, where w represent the set of synaptic coefficients and D is the training dataset. In the following, we will use the vector notation w when referring to the whole set of synapses and to the scalar notation w when referring to a single synapse.

The posterior probability distribution $p(w|D)$ can be obtained by MCMC sampling (by using the Metropolis-Hastings algorithm, or, preferably, the No-U-Turn MCMC Sampling) or approximated by variational inference (VI) as described in the article of A. Kucukelbir et al. entitled "Automatic Differentiation Variational Inference" published in Journal of Machine Learning Research, No. 18, 2017, pp. 1-45 and also in the article of C. Blundell et al. entitled "Weight uncertainty in neural network" published in Proc. of the $32^{nd}$ Int'l Conference on Machine Learning, Lille, France, 2015, vol. 17. Examples of VI methods are mean-field VI or automatic differentiation VI, known as ADVI. For the sake of simplification, but without prejudice of generalization, the description VI will be limited to ADVI in the following.

It is first assumed that the synaptic coefficients are independent from each other, i.e. if the posterior probability distribution function $p(w|D)$ can be expressed as a product of the marginal posterior probability functions of the synaptic coefficients, $$p(w \mid D) = \prod_q p(w^q \mid D)$$

and the problem boils down to represent the marginal posterior probability function of each synaptic coefficient, $p(w|D)$.

This is in particular the case when the posterior probability distribution function $p(w|D)$ is approximated by an analytic distribution, when using the ADVI algorithm. The analytic distribution, also known variational density can be chosen as a multinomial Gaussian distribution whereby each synapse is defined by a mean and standard deviation.

As recalled in the introductory part, the marginal posterior probability distribution of each synaptic coefficient can be approximated by a linear combination of a plurality K of Gaussian distributions, also referred to as Gaussian components:

$$p(w \mid D) \square \sum_{k=1}^{K} \lambda_k g(w; \mu_k, \sigma_k^2) \tag{3}$$

where $$g(.; \mu_k, \sigma_k^2)$$

denotes the $k^{th}$ Gaussian component, of mean $\mu_k$ and standard deviation $\sigma_k$, and where $\lambda_k$ is a weighting factor. The weighting factors satisfy the constraint $$\sum_{k=1}^{K} \lambda_k = 1.$$

The set of parameters $\Omega=\{\lambda_k, \mu_k, \sigma_k | k=1, \ldots, K\}$ of the GMM can be obtained iteratively by using the expectation-maximization (EM) algorithm.

First, the conventional EM algorithm will be briefly recalled below and next an adapted version thereof for the purpose of the present invention will be presented.

Basically, the EM algorithm starts with an initial guess of the parameters $\omega(0)=\{\mu_k(0), \sigma_k(0) | k=1, \ldots, K\}$ and estimates the membership probabilities of each sample, $\lambda_{k,j}(0)$, that is the probability that sample $w_j$ originates from the $k^{th}$ Gaussian distribution. Then the expectation of the log likelihood $$\log L(\Omega; w) = \log\left(\sum_{k=1}^{K} \lambda_k(0) g(w; \mu_k, \sigma_k^2)\right)$$

is calculated over the samples $w_1, w_2, \ldots, w_J$ on the basis of their respective membership probabilities and set of parameters $\Omega(1)$ maximizing this expectation is derived. The parameters $\omega(1)=\{\mu_k(1), \sigma_k(1) | k=1, \ldots, K\}$ belonging to $\Omega(1)$ are then used as new estimates for a next step. The expectation calculation and maximization steps alternate until the expectation of $\log L(\Omega; w)$ saturates, i.e. does not increase by more than a predetermined threshold in comparison with the preceding step. Alternatively, the stopping criterion can be based on Kullback-Leibler divergence between the combination of Gaussian components and the target posterior probability distribution.

The relationship between the mean value and the standard deviation of a conductance in a RRAM cell:

$$\sigma = h(\mu) = \sigma_0 - \eta \cdot \mu \tag{4}$$

where $\eta$ is a positive coefficient given by the hardware implementation, constrains the choice of the parameters of the Gaussian components in (3) to a one-dimension space. In other words, the log-likelihood maximization step of the EM algorithm is performed over only a subset $\tilde{\Omega}=\{\lambda_k, \mu_k, h(\mu_k) | k=1, \ldots, K\}$ of the whole set of parameters $\Omega$.

Figure 2A:
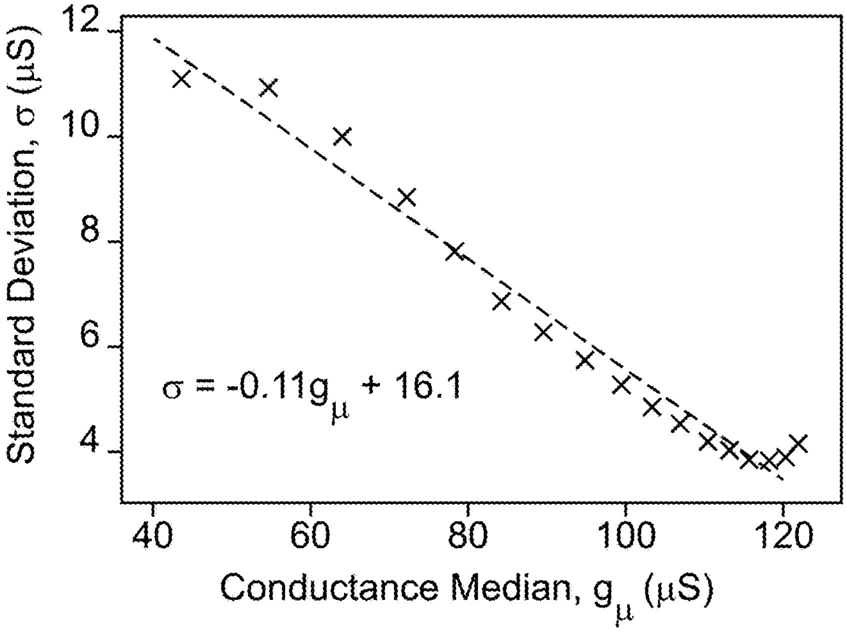
FIG. 2A illustrates the domain available for programming a mean value and standard deviation of a Gaussian component in a prior art RRAM implemented BNN.

FIG. 2A illustrates the domain available for programming a synaptic coefficient due to the constraint expression by relationship (4). It can be seen that the higher the mean (or equivalently, the median) conductance value, the lower the standard deviation. The choice of parameters is therefore limited to those located line $\Delta$. In other words, the available domain for programming or hardware compliance domain, $\Gamma$ is reduced to $\Delta$.

According to an aspect of the present invention, this constraint is lifted by using, for implementing each gaussian component, a combination of at least two RRAM memristors, and consequently by introducing additional degrees of freedom to expand the domain available for hardware programming the BNN parameters.

It is first recalled that the difference $X_1-X_2$ between two normally distributed random variables $$X_1 \square N(\mu_1, \sigma_1^2) \text{ and } X_2 \square N(\mu_2, \sigma_2^2)$$

is still normally distributed:

$$X_1 - X_2 \square N(\mu_1 - \mu_2, \sigma_1^2 + \sigma_2^2).$$

More generally, if we consider a plurality M of independent normally distributed random variables $$X_m \square N(\mu_m, \sigma_m^2),\ m = 1, \ldots, M$$

the linear combination $$X = \sum_{m=1}^{M} \varepsilon_m X_m$$

where $\varepsilon_m=\pm 1$ is still a normally distributed random variable:

$$X \square N\left(\sum_{m=1}^{M} \varepsilon_m \mu_m, \sum_{m=1}^{M} \sigma_m^2\right).$$

Now, if each random variable $X_m$ can be generated by programming a RRAM cell, and assuming that the conductances of these cells can be combined as the variables $X_m$, the hardware compliance domain $\Gamma$, will be extended to the set of points represented by $$\left(\sum_{m=1}^{M} \varepsilon_m \mu_m, \sqrt{\sum_{m=1}^{M} (h(\mu_m))^2}\right).$$

Figure 2B:
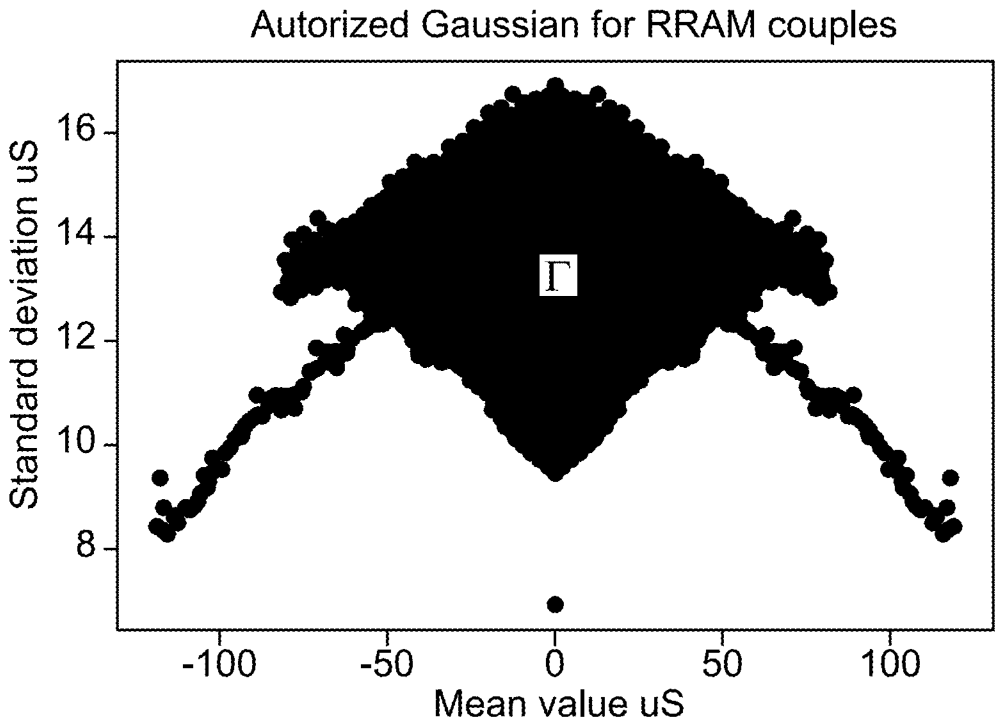
FIGS. 2B and 2C respectively illustrates the available domain for programming a mean value and standard deviation of a Gaussian component according to a first example and a second example of a method for programming a BNN in a RRAM, according to the present invention.

FIG. 2B illustrates the available domain for hardware programming a synaptic coefficient by using a combination of a plurality of normally distributed random variables $$X_m \square N(\mu_m, (h(\mu_m))^2) \text{ for } M = 2.$$

More specifically, the available domain of mean value and standard deviation is provided by the difference $X_1-X_2$. The mean value $\mu=\mu_1-\mu_2$ is indicated on the abscissa axis and the standard deviation $$\sigma = \sqrt{(h(\mu_1))^2 + (h(\mu_2))^2}$$

on the ordinate axis. As it can be seen, the available domain is now expanded to a coarsely diamond-shaped area (corresponding to HCS conductance values) with two side wings (corresponding to the LCS conductance values). The man skilled in the art will understand that it is now possible to increase the mean value while increasing the standard deviation altogether. Indeed, starting from a couple $$\left(\mu = \mu_1 - \mu_2, \sigma = \sqrt{(h(\mu_1))^2 + (h(\mu_2))^2}\right),$$

this result can be achieved by leaving $\mu_1$ unchanged and decreasing $\mu_2$. Indeed, by so doing, $\mu$ is increased and $\sigma$ is also increased ($h(\mu_1)$ is left unchanged and $h(\mu_2)$ is increased). Conversely, it is possible to decrease the mean value while decreasing the standard deviation altogether. For so doing, $\mu_1$ is left unchanged and $\mu_2$ is increased. The various possibilities of acting on ($\mu$, $\sigma$) are summarized hereinafter in Table I:

TABLE I

| target achieved on ($\mu$, $\sigma$) | action to be applied on $\mu_1$ | action to be applied on $\mu_2$ |
|---|---|---|
| (decrease, decrease) | None | Increase |
| (decrease, increase) | Decrease | None |
| (increase, decrease) | Increase | None |
| (increase, increase) | None | Decrease |

Figure 2C:
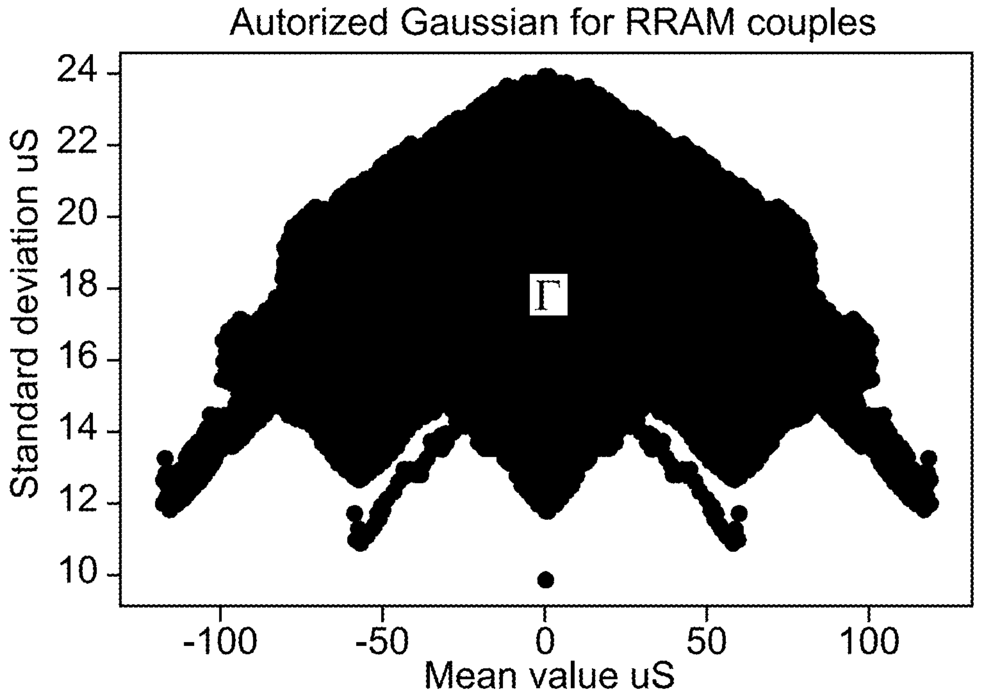

FIG. 2C illustrates the available domain for hardware programming a synaptic coefficient by using a combination of a plurality of normally distributed random variables $X_m \square N(\mu_m,(h(\mu_m))^2)$ for M=4.

More specifically, the available domain of mean value and standard deviation is provided by the combination $X_1-X_2+X_3-X_4$. The mean value $\mu=\mu_1-\mu_2+\mu_3-\mu_4$ is indicated on the abscissa axis and the standard deviation $$\sigma = \sqrt{\sum_{m=1}^{4} (h(\mu_m))^2}.$$

The hardware compliance domain is expanded with respect to the case M=2.

Figure 3:
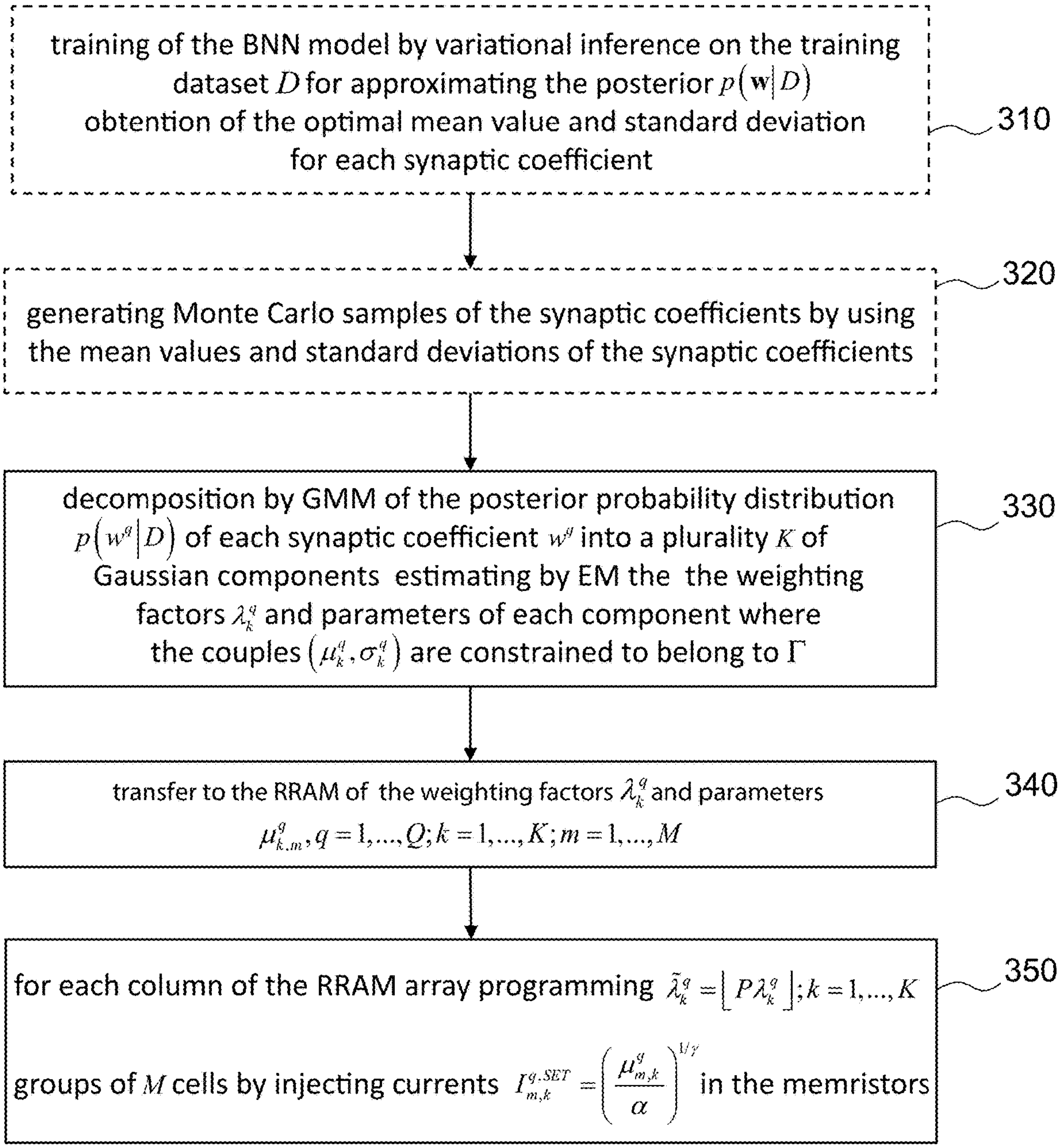
FIG. 3 schematically represents the flowchart of a method for training a BNN, and a method for programming it in a RRAM according to a first embodiment of the invention.

FIG. 3 schematically represents the flowchart of a method for training a BNN, and for programming it in a RRAM according to a first embodiment of the invention.

In a preliminary step, 310, the BNN model is trained on the training dataset D, to obtain samples of the synaptic coefficients.

Preferably, the training is performed by variational inference (ADVI). The purpose of ADVI is to approximate the posterior distribution of the synaptic coefficients p(w|D) by analytic distribution known as variational density. The variational density can be chosen as a multinomial Gaussian distribution whereby the posterior distribution of each synaptic coefficient, denoted $w^q$, can be represented by a Gaussian random variable defined by a mean value $\mu^q$ and a standard deviation $\sigma^q$.

At step 320, samples of the synaptic coefficients are generated by Monte Carlo sampling the Gaussian random variables having the mean values and standard deviations thus obtained $\mu^q$, $\sigma^q$; q=1, . . . , Q where Q is the number of synapses in the BNN.

Steps 310 and 320 are carried out prior to the method of programming the trained BNN in the RRAM, and are therefore represented with dotted lines.

At step 330, the posterior distribution of samples of each synaptic coefficient obtained at step 320 is decomposed by GMM into a plurality K of Gaussian components The (first and second order) parameters of these components are estimated by using the expectation-maximization (EM) algorithm. Importantly, at each iteration of the EM algorithm, the couples constituted by the mean values and standard deviations of the Gaussian components are constrained to belong to the available domain for programming, $\Gamma$.

More specifically, the maximization step of the likelihood (ML) of the mean values and standard deviations of the Gaussian components is performed under the constraint that $(\mu, \sigma) \in \Gamma$.

Figure 4:
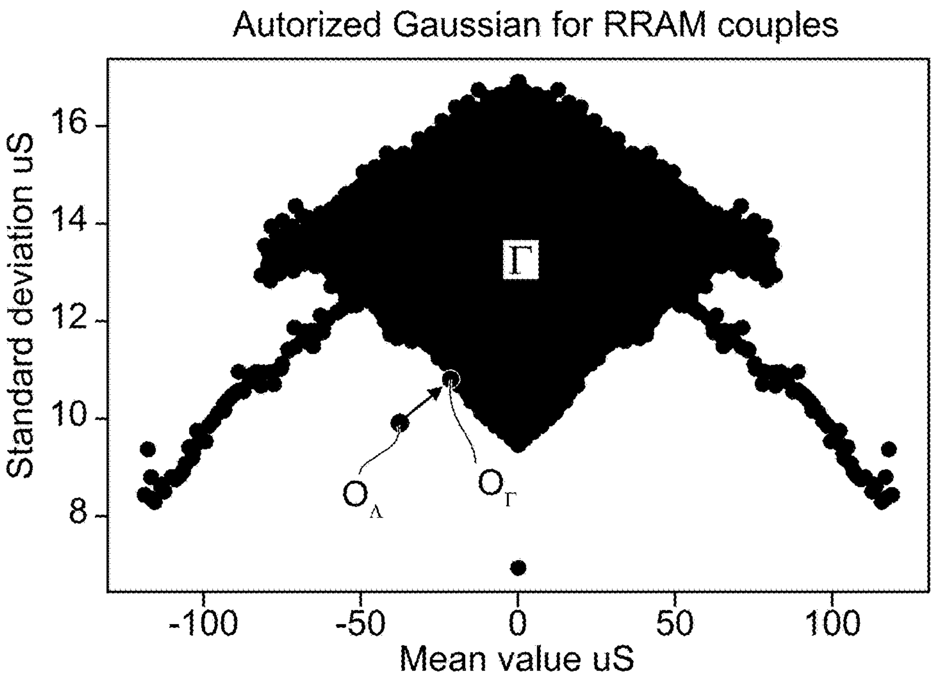
FIG. 4 illustrates the selection of a point in the available domain for programming, according to a step of FIG. 3.

This constraint imposed during the maximization step is illustrated in FIG. 4 for M=2. The point $O_\Lambda$ representing the couple $(\mu_\Lambda, \sigma_\Lambda)$ corresponding to ML of the mean values and standard deviations of the Gaussian components, in projected onto $\Gamma$. In other words, the point $O_\Gamma \in \Gamma$ which is the closest to $O_\Lambda$, within the meaning of a certain distance $\delta$, is retained for the next iteration of the EM algorithm.

Different types of distances can be used for selecting $O_\Gamma$. For example, one may wish to give more weight to the mean value than to the standard deviation (or vice versa). A possible expression for $\delta$ can be:

$$\delta(Q_\Lambda, Q_\Gamma) = \sqrt{\alpha|\mu_\Lambda - \mu_\Gamma|^2 + \beta|\sigma_\Lambda - \sigma_\Gamma|^2} \tag{5}$$

where $0<\alpha, \beta<1$.

Let us now consider the case of a synaptic coefficient, $w^q$. The EM algorithm is first initialized with initial parameter values, for example, $$\lambda_k^q(0) = 1/K,\ k = 1, \ldots , K,\ (\mu_k^q(0), \sigma_k^q(0)),\ k = 1, \ldots , K,$$

are points sampled from $\Gamma$, and then iterates.

Once the EM algorithm has converged, the GMM decomposition of the probability distribution, provides a set of K parameters $$\{\lambda_k^q, \mu_k^q, \sigma_k^q\},\ k = 1, \ldots , K, \text{ each pair } (\mu_k^q, \sigma_k^q)$$

corresponding to a point belonging to the hardware compliance domain $\Gamma$, that is $$(\mu_k^q, \sigma_k^q)$$

meets the constraint:

$$\mu_k^q = \sum_{m=1}^{M} \varepsilon_{k,m}^q \mu_{k,m}^q \tag{6-1}$$

$$\sigma_k^q = \sqrt{\sum_{m=1}^{M} \left(h(\mu_{k,m}^q)\right)^2} \tag{6-2}$$

where h is the hardware constraint linking the mean value and the standard deviation of the conductance (of a memristor) programmed by a SET or a RESET operation in a RRAM cell.

At step 340, for each synaptic coefficient of the BNN model, $w^q$, q=1, . . . , Q, the set of K·M mean values $$\mu_{k,m}^q,\ k = 1, \ldots , K,\ m = 1, \ldots , M,$$

and the set of K weighting factors, $$\lambda_k^q,\ k = 1, \ldots , K,$$

are transferred to the BNN chip.

In this regard, training step 310, the synaptic coefficients sampling step 320 and the composition step 330 can be carried out in a calculation server of the Cloud and the results transferred in 340 to the BNN chip, located e.g. at the edge of a network or in a mobile terminal.

At step 350, each synapse $w^q$, q=1, . . . , Q of the BNN is implemented by $$\tilde{\lambda}_k^q = \lfloor \lambda_k^q P \rfloor$$

times repeating (where P is a factor integer common to all the synapses) for each component k=1, . . . , K, a pattern of M RRAM cells programmed by respectively injecting the programming currents in the memristors (for a SET operation):

$$I_{k,m}^{q,SET} = \left(\frac{\mu_{k,m}^q}{\alpha}\right)^{\frac{1}{\gamma}} \tag{7}$$

Hence, it will be understood that the amount $$\sum_{k=1}^{K} \tilde{\lambda}_k^q \sum_{m=1}^{M} \varepsilon_{k,m}^q \mu_{k,m}^q$$

where $$g_{k,m}^q$$

are the conductances of the RRAM cells thus programmed, can be regarded as a sample of a distribution approximating the posterior distribution of synaptic coefficient $w^q$ of the BNN, after it has been trained.

Preferably, for each q=1, . . . , Q, k=1, . . . , K, $\exists$m, m'$\in${1, . . . , M} such that $$\mathcal{E}_{k,m}^q = -\mathcal{E}_{k,m'}^q.$$

Typically, M is chosen as an even number, namely M=2M', and $$\text{Card}\left\{\mathcal{E}_{k,m}^{q}=+1,\, m=1,\, \ldots\, ,\, M\right\}=\text{Card}\left\{\mathcal{E}_{k,m'}^{q}=+1,\, m'=1,\, \ldots\, ,\, M\right\}$$

for q=1, . . . , Q, k=1, . . . , K. For example, M=2 and consequently $$\mu_k^q=\mu_{k,1}^q-\mu_{k,2}^q,\text{ for } q=1,\, \ldots\, ,\, Q,\, k=1,\, \ldots\, ,\, K.$$

Figure 5:
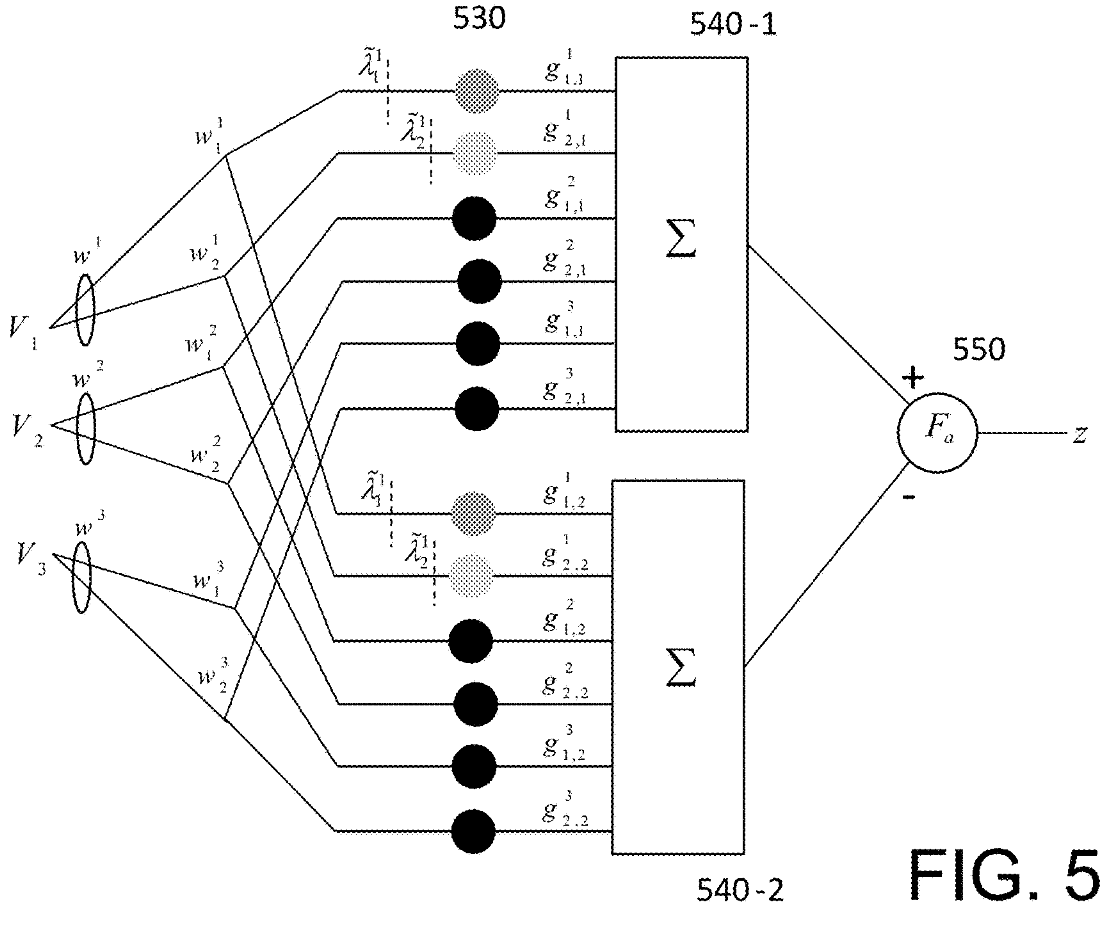
FIG. 5 illustrates an example of a neuron fed with synapses for use in a RRAM implemented BNN.

FIG. 5 schematically illustrates an example of a neuron fed with three synapses for use in a RRAM implemented BNN.

The three synapses respectively input the voltages $V_1$, $V_2$, $V_3$. In this example, Q'=3 synaptic coefficients are each decomposed into K=2 Gaussian components, and each Gaussian component is implemented by a difference of M=2 conductances. The programmed memristors or RRAMs are designated by 530. Each pattern associated with a component (here represented by a shade of grey for the $1^{st}$ synapse, the patterns for the $2^{nd}$ and $3^{rd}$ synapses have been omitted for the sake of simplification) is repeated $$\tilde{\lambda}_k^q$$

times.

The sum $$\sum_{q=1}^{Q'}\sum_{k=1}^{K}\left(\tilde{\lambda}_k^q\sum_{m=1}^{M}\varepsilon_{k,m}^q\mu_{k,m}^q\right)$$

is split into a first part (corresponding to $$\varepsilon_{k,m}^q=+1)$$

which is calculated by the first adder 540-1 and a second part (corresponding to $$\varepsilon_{k,m}^q=-1)$$

which is calculated by the second adder 540-2. In general, M=2M' and the number of inputs to the first/second adder is equal to $$M'\sum_{q=1}^{Q'}\left(\sum_{k=1}^{K}\tilde{\lambda}_k^q\right).$$

The output of the first adder is provided to the non-inverted input of neuron 550 while the output of the second added is provided to the inverted input of the same neuron.

Figure 6:
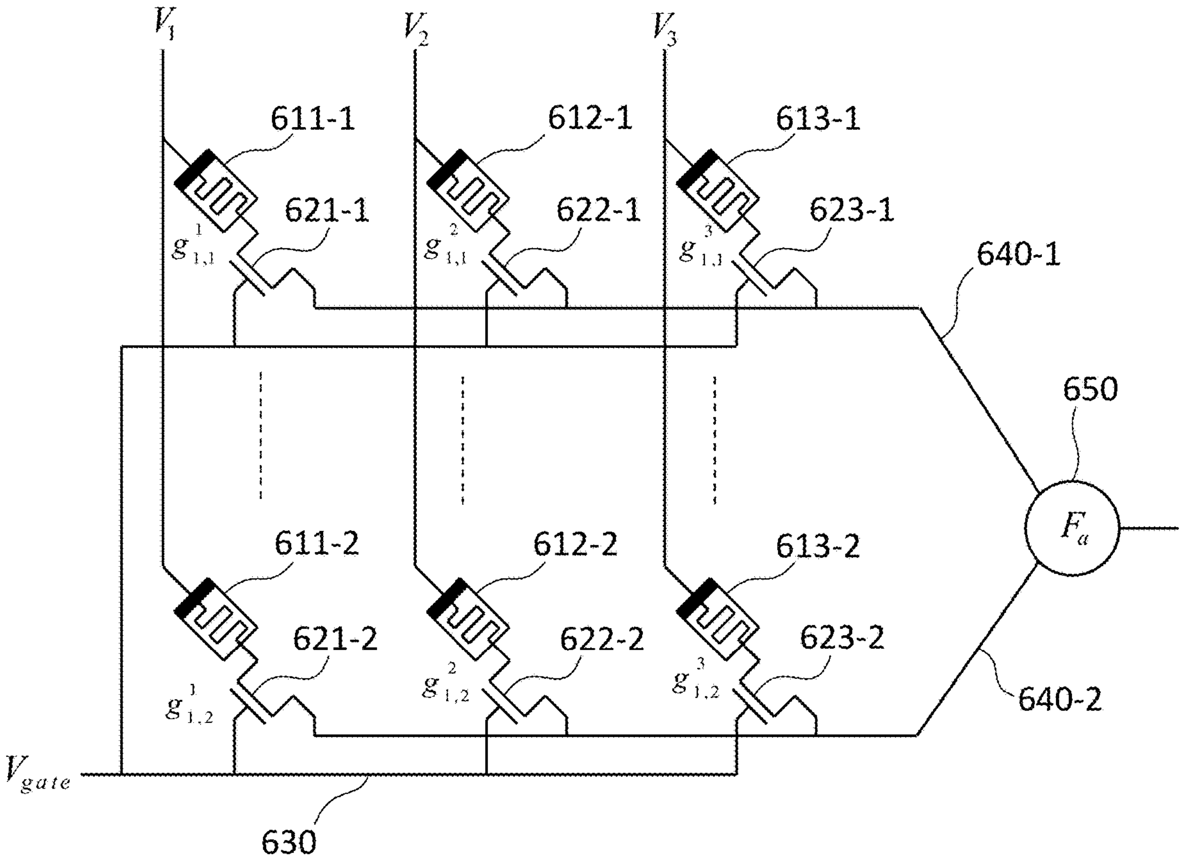
FIG. 6 illustrates the implementation in RRAM of the synapses represented in FIG. 5.

In FIG. 6, the three synapses of FIG. 5 are embodied by RRAM cells connected to a common data line, 630. For the sake of clarity, only one instance of the first component (k=1) of each synapse has been represented.

The upper line corresponds to the terms $$\varepsilon_{1,1}^q=+1$$

and the lower line to the terms $$\varepsilon_{1,1}^q=-1.$$

Each cell comprises a programmable memristor (611-1, 612-1,613-1; 611-2,612-2,613-2) in series with a FET transistor (621-1,622-1,623-1; 621-2,622-2,623-2), the gates of the FET transistors being connected to a control line 630 driven by the voltage $V_{gate}$ and the drains of the FET transistor being connected to the data line. The current flowing through the upper data line 640-1 is here simply the dot product $$g_{1,1}^T V$$

where $V^T=(V_1\ V_2\ V_3)$ is the input vector and $$g_{1,1}^T=\left(g_{1,1}^1\ \ g_{1,1}^2\ \ g_{1,1}^3\right)$$

is the vector of the conductances represented in FIG. 5. Similarly, the current flowing through the lower data line 640-2 is the dot product $$g_{1,2}^T V \text{ where } g_{1,2}^T=\left(g_{1,2}^1\ \ g_{1,2}^2\ \ g_{1,2}^3\right).$$

In general, as explained above, there are $$M'\sum_{q=1}^{Q'}\left(\sum_{k=1}^{K}\tilde{\lambda}_k^q\right).$$

lines connected to the non-inverted input of neuron 650 and the same number of lines connected to the inverted input thereof.

The neuron 650 applies an activation function, $F_a$, to the differential input.

The first embodiment of the invention concerned the case where, after training of the BNN on the dataset, the synaptic coefficients were uncorrelated.

In practice however, after the BNN has been trained ex situ on the dataset, the synaptic coefficients are not independently distributed. In particular, if the posterior probability distribution of the synaptic coefficients is obtained by a MCMC method, the mean values and standard deviations of the Gaussian components alone fail to capture this probability distribution. The covariance matrix of the synaptic coefficients has to be taken into account as described further below.

Figure 7:
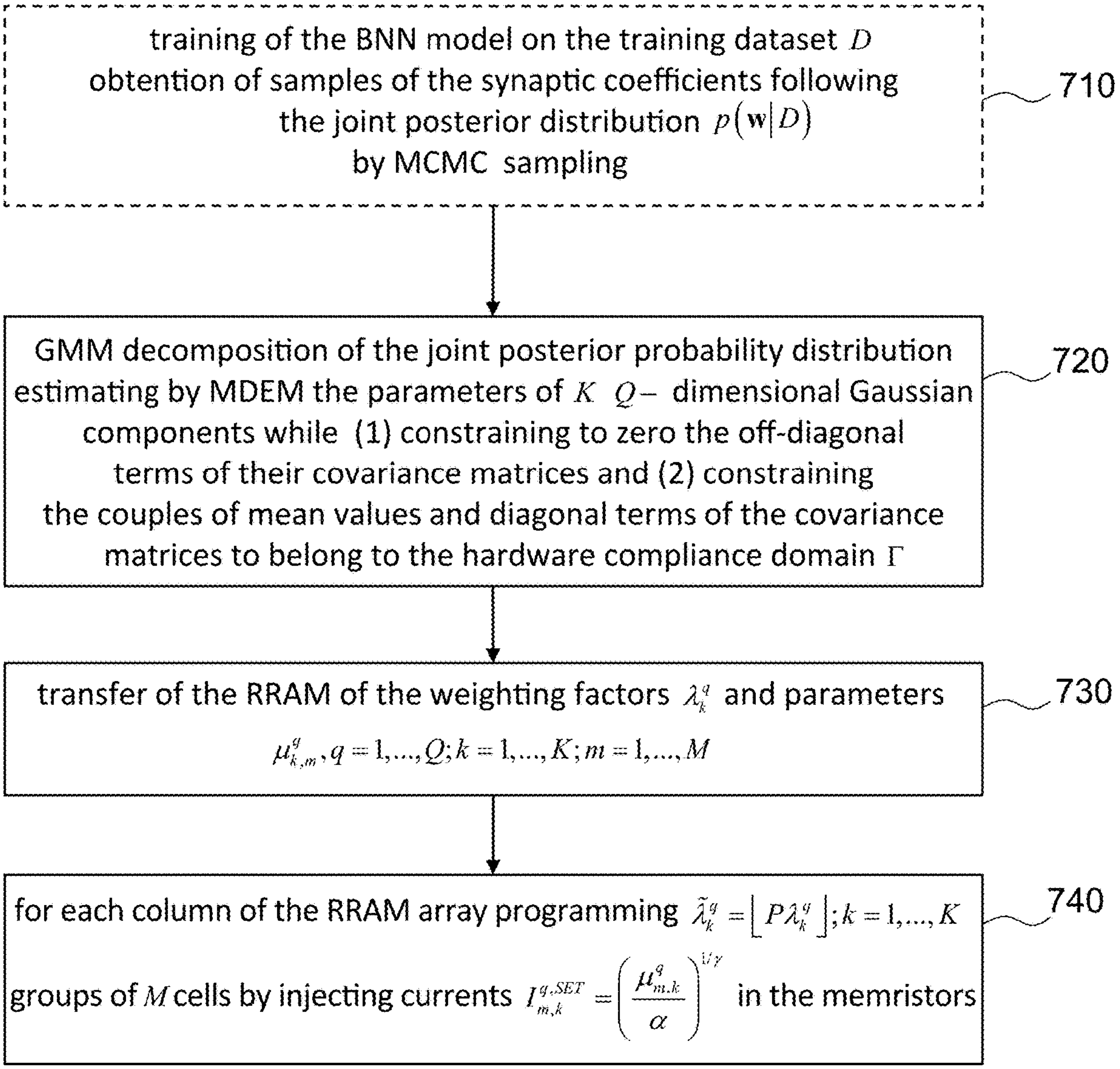
FIG. 7 schematically represents the flow chart of a method for training a BNN, and a method for programming it in a RRAM according to a second embodiment of the invention.

FIG. 7 schematically represents the flow chart of a method for training a BNN, and for programming it in a RRAM according to a second embodiment of the invention.

In a preliminary step, 710, the BNN model is trained on the training dataset D, to obtain samples of the synaptic coefficients following the joint posterior probability distribution of the synaptic coefficients p(w|D). These samples can be obtained by a MCMC method for example a No-U-Turn MCMC Sampling method as mentioned above.

Step 710 is carried out prior to the method of programming the trained BNN in the RRAM, and are therefore represented with dotted lines.

At step 720, the joint posterior distribution of samples of the synaptic coefficients is decomposed by GMM into a plurality K of components, each component following a multivariate normal distribution. The weighting factors and parameters of the components are estimated by using a multi-dimensional expectation-maximization algorithm or MDEM.

The principle of MDEM is the same as EM but applied to a multi-dimensional distribution, with alternating expectation calculation and maximisation steps.

By choosing K large enough, it is possible to impose that the Gaussian components are independent. This situation is shown on the example illustrated in FIGS. 8A and 8B.

Figure 8A:
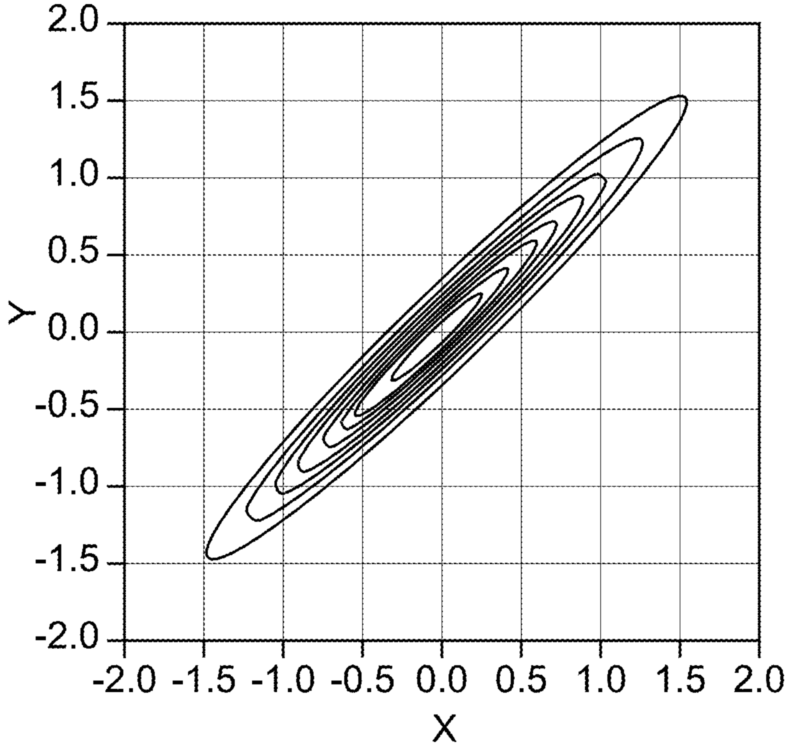
FIGS. 8A and 8B shows how the probability distribution of a multi-variate full rank Gaussian random variable can be approximated by the distribution of a plurality of independent mean-field multi-variate independent Gaussian random variables.
Figure 8B:
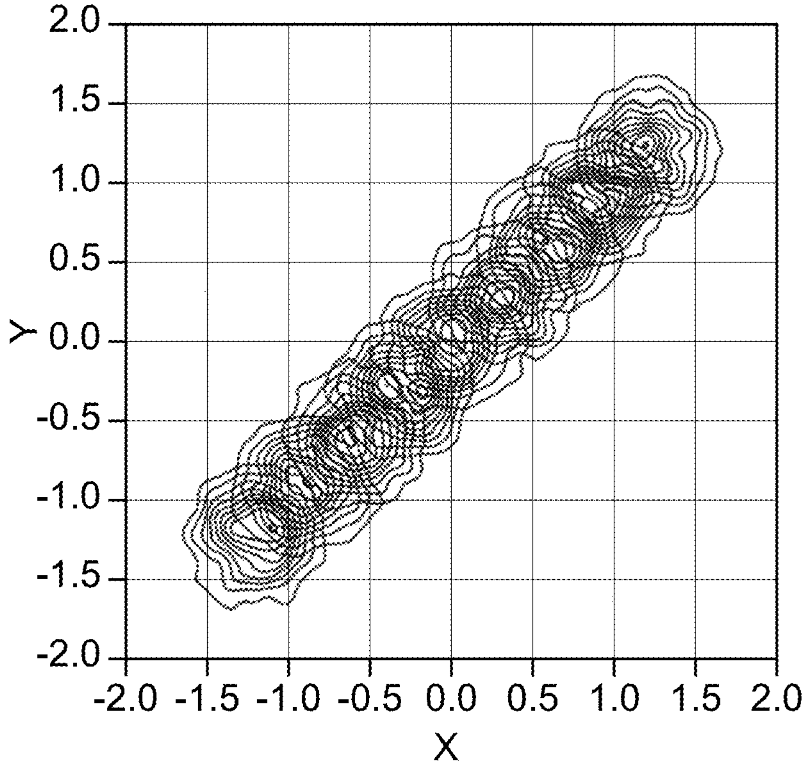

FIG. 8A represents the joint probability distribution of a bidimensional Gaussian variable, for example the probability distribution of a couple of synaptic coefficients of two synapses connected to the same neuron. As it can be seen from the figure, the two synaptic coefficients are not independent, in other words their covariance matrix comprises off-diagonal terms. However, it is possible to model this probability distribution by mapping it with the distribution of a plurality of so-called "mean-field" bidimensional Gaussian variables, as shown on FIG. 8B.

This property can be extended to multi-dimensional Gaussian random variables of arbitrary dimension, e.g. Q (number of synapses in the BNN).

Going back to step 720, the MDEM algorithm is initialized with a plurality K of Q-dimensional mean-field normal distribution parameters, that is KQ mean values $$\mu_k^q(0)$$

and standard deviations $$\sigma_k^q(0),$$

k=1, . . . , K, q=1, . . . , Q. The mean values and the standard deviations are chosen so that the couples $$(\mu_k^q(0), \sigma_k^q(0))$$

belong to the hardware compliance domain, Γ. The off-diagonal terms of the K covariance matrices $$C_{Q\times Q}^k(0),$$

k=1, . . . , K are set to zero. As for the EM algorithm the initial weighting factors may be chosen equal to 1, i.e.

$$\mu_k^q(n), k = 1, \dots, K$$

At each iteration n of the MDEM algorithm, the mean values $$\lambda_k^q(0) = 1/K, k = 1, \dots, K, q = 1, \dots, Q.$$

and estimated parameters of the covariance matrices $$C_{Q\times Q}^k(n), k = 1, \dots, K,$$

obtained by the maximization step, are subjected to a double constraint.

First, all the off-diagonal terms are put to zero, thereby imposing each of the K Gaussian components to be effectively mean-field Gaussian within the meaning defined above.)

Second, the mean values, $$\mu_k^q(n),$$

k=1, . . . , K, and the diagonal terms $$(\sigma_k^q(n))^2$$

of the covariance matrices $$C_{Q\times Q}^k(n),$$

k=1, . . . , K, are constrained so that the couples $$(\mu_k^q(n), \sigma_k^q(n))$$

belong to the hardware compliance domain Γ. As in the first embodiment, this constraint can be fulfilled by finding the point of Γ closest to the point $$(\mu_k^q(n), \sigma_k^q(n))$$

within the meaning of a given distance.

The mean values and the parameters of the covariance matrices are then used as parameters for defining the new Gaussian components in the expectation step of the next iteration of the MDEM algorithm.

Once the MDEM algorithm has converged, it provides, for each Gaussian component a set of Q parameters $$\{\lambda_k^q, \mu_k^q, \sigma_k^q\}, q = 1, \dots, Q,$$

each pair $$(\mu_k^q, \sigma_k^q)$$

corresponding to a point belonging to the hardware compliance domain Γ, i.e. a point the coordinates of which meet conditions (6-1) and (6-2).

At step 730, the set of Q·K·M parameters, namely the mean values $$\mu_{k,m}^q, q=1, \ldots, Q, k=1, \ldots, K, m=1, \ldots, M,$$

and the set of Q·K weighting factors, $$\lambda_k^q, q=1, \ldots, Q, k=1, \ldots, K,$$

are transferred to the BNN.

Step 740 is identical to step 350, namely the synapses q=1, . . . , Q of the BNN are implemented by $$\tilde{\lambda}_k^q = \lfloor \lambda_k^q P \rfloor$$

times repeating (where P is a factor integer common to all the synapses) for each component k=1, . . . , K, a pattern of M RRAM cells programmed by respectively injecting the programming currents in the memristors (for a SET operation)

$$I_{k,m}^{q,SET} = \left(\frac{\mu_{k,m}^q}{\alpha}\right)^{\frac{1}{\gamma}}.$$

The method for programming a BNN in a RRAM, according to the second embodiment can further be improved by applying the hardware constrained MDEM algorithm progressively, neuron by neuron and/or layer by layer.

For example, in case it is applied neuron by neuron, in a first round, all the $Q_{1,1}$ synapses connected to the first neuron of the first layer are initialized and the MDEM iterations are performed on the set of the $Q_{1,1}$ synaptic coefficients, thereby providing a set of $Q_{1,1}$·K·M mean values. The programming method then proceeds to a second round, by initializing the $Q_{1,1}+Q_{1,2}$ synaptic coefficients while using the mean values already obtained at the end of the first round, etc. Once the programming of the neurons of the first layer is completed, the method goes on with the programming of the neurons second layer, by using the mean values obtained by MDEM on the first layer as a starting point for initialization. Hence, the dimension of the MDEM increases from one neuron to the next and one layer to the next until it eventually reaches Q.

Alternatively, the MDEM algorithm may be applied directly layer by layer. In such instance, all the $Q_1$ synapses connected to the neurons of the first layer are taken into account in the first round for initialization and iteration, thereby providing thereby providing a set of $Q_1$·K·M mean values. The programming method then proceeds to a second round, by initializing the $Q_1+Q_2$ synaptic coefficients of the first two layers while using the mean values of the synaptic coefficients of the first layer already obtained at the end of the first round, etc. The dimension of the MDEM increases from one layer to the next until it eventually reaches the total number of layers.

The two variants set out above ensure a faster convergence of the MDEM algorithm and therefore of the GMM decomposition.

In each of these variants, a number K of gaussians are used to represent the posterior distribution; for each of these gaussians, the parameters ($\mu_k^q$, $\sigma_k^q$) related to a (any) synaptic coefficient $w^q$ are defined as a function of the mean ($\mu_{k,m}^q$) and the standard deviation ($\sigma_{k,m}^q$) of at least two distributions, whereby by programming the memristors of the RRAM based on the estimated values of the means and the standard deviations of said at least two distributions, the gaussian component can be emulated by at least two memristors of the RRAM memory emulating said at least two distributions.

Further variants can be envisaged, where it is possible to identify group of synapses that covary, the MDEM being performed on each these groups in isolation in a first phase and on the overall network in a second phase.

Whatever the variant envisaged, after the MDEM algorithm has been completed, the mean values and the weighting factors are transferred to the RRAM for the programming the memristors, as illustrated in FIG. 7.

As for classical neural networks, the BNN can be further trained on chip, in the present instance after they the RRAM cells have been programmed.

Figure 9:
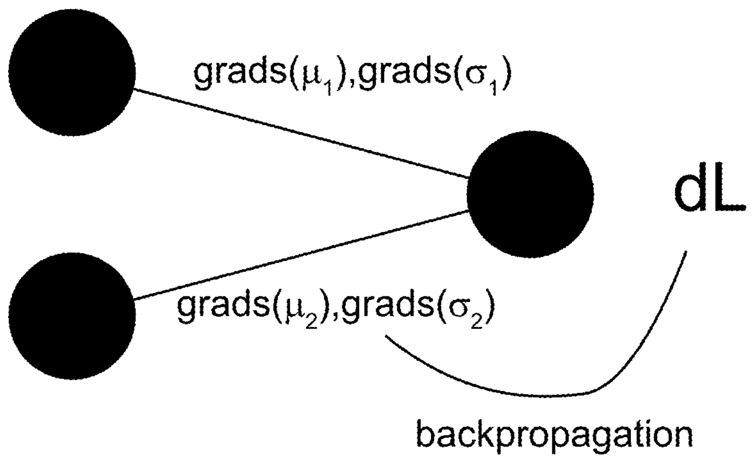
FIG. 9 schematically represents operations performed after backpropagation to update mean values and standard deviation values, during on-chip learning.

At each step of the on-chip learning, the gradients of the loss function L over the mean values and standard deviations are calculated. After backpropagation, the Q·K mean values and standard deviations can be updated by taking a small step (defined by hyperparameter δ) in the direction opposite to the corresponding gradient, as schematically represented in FIG. 9.

Assuming that M=2, i.e. that the mean values are implemented by a difference of conductance of memristors, that is $\mu=\mu_1-\mu_2$, the updating for each synaptic can be performed by using the following table:

TABLE II

| $\left(\text{sign}\left(-\frac{\partial L}{\partial \mu}\right), \text{sign}\left(-\frac{\partial L}{\partial \sigma}\right)\right)$ | action to be applied on $\mu_1$ | action to be applied on $\mu_2$ |
|---|---|---|
| (−, −) | None | increase by $\delta \cdot \mu_2$ |
| (−, +) | decrease by $\delta \cdot \mu_1$ | None |
| (+, −) | increase by $\delta \cdot \mu_1$ | None |
| (+, −) | None | decrease by $\delta \cdot \mu_2$ |

In practice, a small change δ·μ is ensured by a corresponding change, ΔI in the current, ΔI, of the current to be injected in the memristor, in order to reprogram it in a SET operation. The current change can be obtained by logarithmic differentiating $$I = \left(\frac{\mu}{\alpha}\right)^{\frac{1}{\gamma}} : \frac{\Delta I}{I} = \frac{\delta}{\gamma} \tag{8}$$

The above embodiments have been described within the context of programming RRAM memristors by using the C2C variability of the HCS obtained by a SET operation. The man skilled in the art will however understand that they can equally be applied when the RRAM memristors are programmed by using the C2C variability of the LCS obtained by a RESET operation.

The invention claimed is:

1. A method for programming a Bayesian neural network (BNN) in a RRAM memory, said BNN comprising Q synapses, the synapses of said BNN being implemented by memristors of the RRAM memory, the memristors being programmed by a SET or RESET operation, the method comprising:

decomposing a posterior probability distribution of each synaptic coefficient $w^q$, q=1, . . . , Q by GMM into a plurality K of Gaussian components, each component being weighted by a respective weighting factor, $$\lambda_k^q,$$

and being defined by a set of parameters constituted by a its mean value and standard deviation;

estimating the sets of parameters and the weighting factors of the K Gaussian components by expectation-maximization (EM), at each EM iteration the set of parameters of each Gaussian component $$(\mu_k^q, \sigma_k^q)$$

being constrained to belong to a domain defined by $$\mu_k^q = \sum_{m=1}^{M} \varepsilon_{k,m}^q \mu_{k,m}^q,$$

$$\sigma_k^q = \sqrt{\sum_{m=1}^{M} \left(h(\mu_{k,m}^q)\right)^2},$$

where M≥2 is an integer, $$\varepsilon_{k,m}^q = \pm 1,$$

h is a hardware relationship linking a mean value $$\mu_{k,m}^q$$

and a standard deviation $$\sigma_{k,m}^o = h(\mu_{k,m}^q)$$

of a conductance of a memristor m programmed by a SET or a RESET operation;

transferring the mean values $$\mu_{k,m}^q,\ q = 1, \dots, Q, k = 1, \dots, K, m = 1, \dots, M,$$

and the weighting factors, $$\lambda_k^q,\ q = 1, \dots, Q, k = 1, \dots, K$$

to the RRAM memory; and programming the memristors of the RRAM memory by injecting therein currents during a SET operation/applying thereto voltages during a RESET operation, depending upon the mean values $$\mu_{k,m}^q,$$

a number of memristors programmed by injecting a current being dependent upon $$\mu_{k,m}^q$$

being proportional to the weighting factor $$\lambda_k^q.$$

2. The method for programming a Bayesian neural network in a RRAM memory according to claim 1, wherein for each q=1, . . . , Q, k=1, . . . , K, ∃m,m'∈{1, . . . , M} such that $$\varepsilon_{k,m}^q = -\varepsilon_{k,m'}^q.$$

3. The method for programming a Bayesian neural network in a RRAM memory according to claim 2, wherein M is an even number, M=2M', and $$\text{Card}\{\varepsilon_{k,m}^q = +1, m = 1, \dots, M\} = \text{Card}\{\varepsilon_{k,m'}^q = +1, m' = 1, \dots, M\}$$

for q=1, . . . , Q, k=1, . . . , K.

4. The method for programming a Bayesian neural network in a RRAM memory according to claim 2, wherein M=2, $$\mu_k^q = \mu_{k,1}^q - \mu_{k,2}^q, \text{ for } q = 1, \dots Q, k = 1, \dots, K.$$

5. The method for programming a Bayesian neural network in a RRAM memory according to claim 4, wherein each neuron has a differential input comprising a positive input and a negative input, each synaptic coefficient of the BNN connected to a neuron is implemented by 2 groups of $$K\lfloor\lambda_k^q P\rfloor$$

memristors, a first group of $$K\lfloor\lambda_k^q P\rfloor$$

memristors being connected to the positive input of the neuron and a second group of $$K\lfloor\lambda_k^q P\rfloor$$

memristors being connected to the negative input, where P is an integer common to all synapses, the memristors of the first group being programmed by respectively injecting therein the currents $$I_{k,1}^{q,SET} = \left(\frac{\mu_{m,1}^q}{\alpha}\right)^{\frac{1}{\gamma}}$$

during a SET operation while the memristors connected of the second group being programmed by respectively injecting therein the currents $$I_{k,2}^{q,SET} = \left(\frac{\mu_{m,2}^q}{\alpha}\right)^{\frac{1}{\gamma}}$$

during a SET operation, where α, γ are physical parameters of the memristors.

6. The method for programming a Bayesian neural network in a RRAM memory according to claim 5, wherein after the memristors of the RRAM memory have been trained, the BNN is further trained by calculation of a loss function and gradient backpropagation.

7. The method for programming a Bayesian neural network in a RRAM memory according to claim 6, wherein if a mean value $$u_k^q = u_{k,1}^q - u_{k,2}^q$$

is to be decreased while the corresponding standard deviation $$\sigma_k^q$$

is to be decreased, the mean value $$\mu_{k,1}^q$$

is left unchanged while the mean value $$\mu_{k,2}^q$$

is increased.

8. The method for programming a Bayesian neural network in a RRAM memory according to claim 6, wherein if a mean value $$u_k^q = u_{k,1}^q - u_{k,2}^q$$

is to be decreased while the corresponding standard deviation $$\sigma_k^q$$

is to be increased, the mean value $$\mu_{k,1}^q$$

is decreased while the mean value $$\mu_{k,2}^q$$

is left unchanged.

9. The method for programming a Bayesian neural network in a RRAM memory according to claim 8, wherein if a mean value $$u_k^q = u_{k,1}^q - u_{k,2}^q$$

is to be increased while the corresponding standard deviation $$\sigma_k^q$$

is to be increased, the mean value $$\mu_{k,1}^q$$

is left unchanged while the mean value $$\mu_{k,2}^q$$

is decreased.

10. The method for programming a Bayesian neural network in a RRAM memory according to claim 6, wherein if a mean value $$u_k^q = u_{k,1}^q - u_{k,2}^q$$

is to be increased while the corresponding standard deviation $$\sigma_k^q$$

is to be decreased, the mean value $$\mu_{k,1}^q$$

is increased while the mean value $$\mu_{k,2}^q$$

is left unchanged.

11. A method for programming a Bayesian neural network (BNN) in a RRAM memory, said BNN comprising Q synapses, the synapses of said BNN being implemented by memristors of the RRAM memory, the memristors being programmed by a SET or RESET operation, the method comprising:

decomposing a joint posterior probability distribution of the synaptic coefficients, after training of the BNN on a dataset, by GMM into a plurality K of Gaussian multivariate components of dimension Q, each multivariate component being weighted by a respective weighting factor, $$\lambda_k^q,$$

and being defined by first and second order parameters;

estimating the first and second order parameters and weighting factors of the K Gaussian multivariate components by multi-dimensional expectation-maximization (MDEM), at each MDEM iteration the off-diagonal terms of the covariance matrix of each multivariate component being forced to zero and the first and second order parameters of each multivariate component $$(\mu_k^q, \sigma_k^q),\ q = 1, \ldots, Q,$$

being constrained to belong to a domain defined by $$\mu_K^q = \sum_{m=1}^{M} \varepsilon_{k,m}^q \mu_{k,m}^q,\ \sigma_k^q = \sqrt{\sum_{m=1}^{M} \left(h\left(\mu_{k,m}^q\right)\right)^2},$$

where M ≥ 2 is an integer, $$\varepsilon_{k,m}^q = \pm 1,\ h$$

is a hardware relationship linking a mean value $$\mu_{k,m}^q$$

and a standard deviation $$\sigma_{k,m}^q = h\left(\mu_{k,m}^q\right)$$

of the conductance of a memristor m programmed by a SET or a RESET operation;

transferring the mean values $$\mu_{k,m}^q,\ q = i, \ldots, Q,\ k = 1, \ldots, K,\ m = 1, \ldots, M,$$

and the weighting factors, $$\lambda^q,\ q - 1, \ldots, Q,\ k = 1, \ldots, K$$

(730) to the RRAM memory; and programming the memristors of the RRAM memory are programmed by injecting therein currents during a SET operation/applying thereto voltages during a RESET operation, depending upon the mean values $$\mu_{k,m}^q,$$

a number of memristers programmed by injecting a current dependent upon $$\mu_{k,m}^q$$

being proportional to the weighting factor $$\lambda_k^q.$$

12. The method for programming a Bayesian neural network in a RRAM memory according to claim 11, wherein for each $$q = 1, \ldots, Q,\ k = 1, \ldots, K,\ \exists\, m, m' \in \{1, \ldots, M\}$$

such that $$\varepsilon_{k,m}^q = -\varepsilon_{k,m'}^q.$$

13. The method for programming a Bayesian neural network in a RRAM memory according to claim 12, wherein M is an even number, M=2M', and $$\mathrm{Card}\left\{\varepsilon_{k,m}^q = +1,\ m = 1, \ldots, M\right\} = \mathrm{Card}\left\{\varepsilon_{k,m'}^q = +1,\ m' = 1, \ldots, M\right\} \text{ for } q = 1, \ldots, Q,\ k = 1, \ldots, K.$$

14. The method for programming a Bayesian neural network in a RRAM memory according to claim 12, wherein $$M = 2, \mu_k^q = \mu_{k,1}^q - \mu_{k,2}^q, \text{ for } q = 1, \ldots, Q, k = 1, \ldots, K.$$

15. The method for programming a Bayesian neural network in a RRAM memory according to claim 14, wherein each neuron has a differential input comprising a positive input and a negative input, each synaptic coefficient of the BNN connected to a neuron is implemented by 2 groups of $$K\lfloor \lambda_k^q P \rfloor$$

memristors, a first group of $$K\lfloor \lambda_k^q P \rfloor$$

memristors being connected to the positive input of the neuron and a second group of $$K\lfloor \lambda_k^q P \rfloor$$

memristors being connected to the negative input where P is an integer common to all synapses, the memristors of the first group being programmed by respectively injecting therein the currents $$I_{k,1}^{q,SET} = \left(\frac{\mu_{m,1}^q}{\alpha}\right)^{\frac{1}{\gamma}}$$

during a SET operation while the memristors connected of the second group being programmed by respectively injecting therein the currents $$I_{k,2}^{q,SET} = \left(\frac{\mu_{m,2}^q}{\alpha}\right)^{\frac{1}{\gamma}}$$

during a SET operation, where $\alpha$, $\gamma$ are physical parameters of the memristors.

16. The method for programming a Bayesian neural network in a RRAM memory according to claim 15, wherein after the memristors of the RRAM memory have been trained, the BNN is further trained by calculation of a loss function and gradient backpropagation.

17. The method for programming a Bayesian neural network in a RRAM memory according to claim 16, wherein if a mean value $$\mu_k^q = \mu_{k,1}^q - \mu_{k,2}^q$$

is to be decreased while the corresponding standard deviation $$\sigma_k^q$$

is to be decreased, the mean value $$\mu_{k,1}^q$$

is left unchanged while the mean value $$\mu_{k,2}^q$$

is increased.

18. The method for programming a Bayesian neural network in a RRAM memory according to claim 16, wherein if a mean value $$\mu_k^q = \mu_{k1}^q - \mu_{f,2}^q$$

is to be decreased while the corresponding standard deviation $$\sigma_k^q$$

is to be increased, the mean value $$\mu_{k,1}^q$$

is decreased while the mean value $$\mu_{k,2}^q$$

is left unchanged.

19. The method for programming a Bayesian neural network in a RRAM memory according to claim 11, wherein, in a first round, the multi-dimensional expectation-maximization estimates the first and second order parameters and weighting factors of the K Gaussian multivariate components for all the synapses connected to a first neuron of a layer, then the first and order parameters thus obtained are used for initializing the parameters of a second round in which the first and second order parameters and weighting factors of the K Gaussian multivariate components for all the synapses connected to the first and a second neuron of this layer, and so forth until all the first and second order parameters and weighting factors of the K Gaussian multivariate components for all the synapses of said layer are eventually estimated.

20. The method for programming a Bayesian neural network in a RRAM memory according to claim 11, wherein, in a first round, the multi-dimensional expectation-maximization estimates the first and second order parameters and weighting factors of the K Gaussian multivariate components for all the synapses connected to neurons of a first layer, then the first and order parameters thus obtained are used for initializing the parameters of a second round in which the first and second order parameters and weighting factors of the K Gaussian multivariate components for all the synapses connected to neurons of the first layer and a second layer, and so forth until all the first and second order parameters and weighting factors of the K Gaussian multivariate components for all the synapses of the BNN are eventually estimated.

* * * * *